United States Patent [19]
Sneed et al.

[11] Patent Number: 5,354,384
[45] Date of Patent: Oct. 11, 1994

[54] METHOD FOR CLEANING SURFACE BY HEATING AND A STREAM OF SNOW

[75] Inventors: John D. Sneed, Long Beach; Wilfried Krone-Schmidt, Fullerton; Michael J. Slattery, Gardena; Howard S. Bowen, Los Angeles, all of Calif.

[73] Assignee: Hughes Aircraft Company, Los Angeles, Calif.

[21] Appl. No.: 56,684

[22] Filed: Apr. 30, 1993

[51] Int. Cl.$^5$ ................................................ B08B 7/04
[52] U.S. Cl. ................................................ 134/6; 134/7; 134/26; 134/30
[58] Field of Search .................... 134/6, 7, 8, 26, 30

[56] References Cited

U.S. PATENT DOCUMENTS

| | | | |
|---|---|---|---|
| 4,631,250 | 12/1986 | Hayashi | 134/7 X |
| 4,655,847 | 4/1987 | Ichinoseki et al. | 134/7 |
| 4,806,171 | 2/1989 | Whitlock et al. | 134/7 |
| 4,962,891 | 10/1990 | Layden | 239/597 |
| 4,977,910 | 12/1990 | Miyahara et al. | 134/7 |
| 5,035,750 | 7/1991 | Tada et al. | 134/7 |
| 5,062,898 | 11/1991 | McDermott et al. | 134/7 |
| 5,094,696 | 3/1992 | Orsen | 134/7 |
| 5,108,512 | 4/1992 | Goffnett et al. | 134/7 |
| 5,125,979 | 6/1992 | Swain et al. | 134/7 |
| 5,147,466 | 9/1992 | Ohmori et al. | 134/7 |
| 5,209,028 | 5/1993 | McDermott et al. | 134/7 X |
| 5,217,925 | 6/1993 | Ogawa et al. | 134/7 X |

OTHER PUBLICATIONS

R. C. Loveridge, "CO2 Jet Spray Cleaning of IR Thin Film Coated Optics," SPIE 36th International Symposium on Optical and Optoelectric Applied Science & Engineering, Jul. 21–26, 1991, San Diego, Calif.

S. A. Hoenig, "The Application of Dry Ice to the Removal of Particulates from Optical Apparatus, Spacecraft, Semiconductor Wafers, and Equipment used in Containmant Free Manufacturing Processes," Sep., 1985.

*Primary Examiner*—Richard O. Dean
*Assistant Examiner*—Saeed T. Chaudhry
*Attorney, Agent, or Firm*—M. E. Lachman; M. W. Sales; W. K. Denson-Low

[57] ABSTRACT

An improved apparatus and method for removing trace contaminants from the surface of a chosen substrate, such as delicate surfaces or precision parts, wherein the improvement consists of heating a portion of a chosen substrate surface immediately before, during and/or after application of a stream of cleaning snow to the same portion of the substrate surface.

16 Claims, 1 Drawing Sheet

U.S. Patent     Oct. 11, 1994     5,354,384
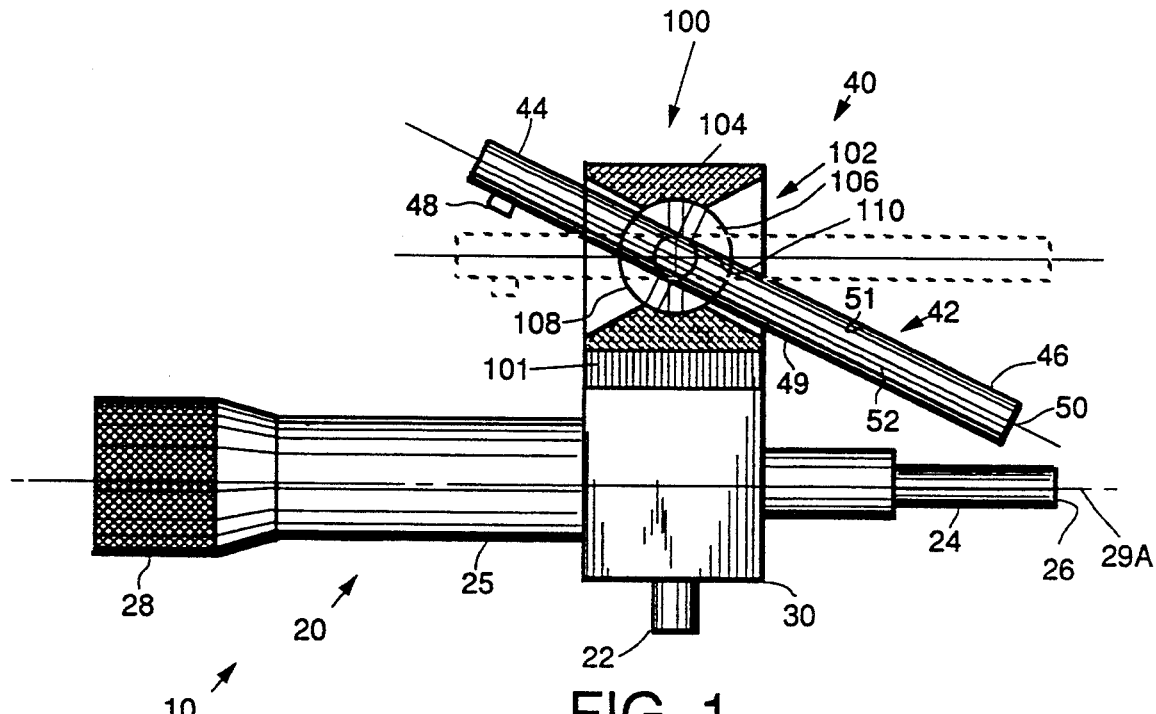
FIG. 1.
FIG. 2.
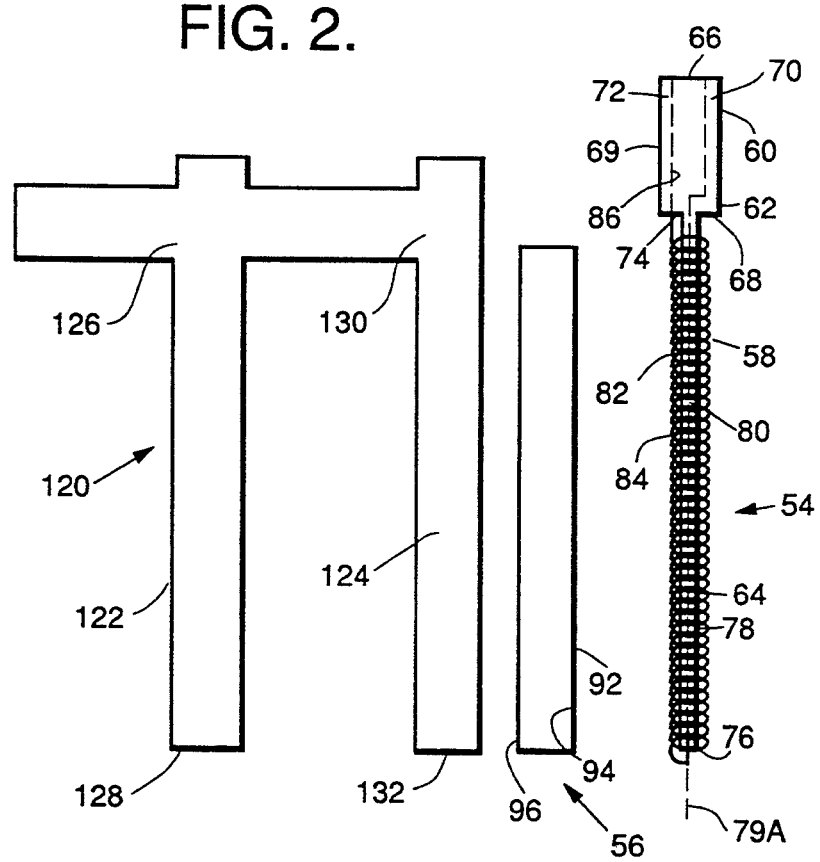

METHOD FOR CLEANING SURFACE BY HEATING AND A STREAM OF SNOW

BACKGROUND OF THE INVENTION

1. Field of Invention

The present invention relates generally to apparatus and methods for use in the precision cleaning of substrate surfaces. More particularly, the present invention relates to apparatus and methods for removing trace contaminants from delicate surfaces and precision hardware such as that found in high sensitivity optical, electronic and precision mechanical equipment.

2. Description of Related Art

It is essential that delicate and precision surfaces of optical-mechanical-electronic equipment be contaminant-free. For example, infrared optical sensor systems use thin film optical coatings to enhance in-band transmittance and reject out-of-band radiation. Even trace amounts of contaminations degrade spectral performance by scattering, absorbing, or reflecting incident radiation.

Particulate and molecular contaminants present on optical surfaces can cause problems by changing emittance characteristics thereby increasing thermal noise in optical devices. Dust and debris contamination present on a detector surface may also generate clutter in the appearance of false targets. Further, the presence of molecular contaminants on precision optical equipment surfaces, such as lenses, windows and optical filters, results in the absorption and scatter of incident energy with the resultant decrease in system quality.

In precision computer and gyroscope equipment, particulate contamination in a moving disk drive or in a spinning gyroscope stator may damage or disable such a system beyond repair. Technologies used in manufacturing integrated circuits also require that substrates be free of particulates and molecular contaminants.

Precision cleaning apparatus and methods are not limited in use to high technology applications. For example, the presence of particulate and molecular contaminants on such substrates as automobile body panels impairs the integrity of the coatings applied thereon and may result in peeling or bubbling of the coated surface.

A wide variety of cleaning solvents and solutions, such as chlorofluorocarbons and ketones, have been utilized to clean delicate surfaces. However, the majority of these cleaning solutions and solvents are environmentally hazardous. In response to these environmental concerns, a number of environmentally safe cleaning mediums had been proposed, one of which is carbon dioxide.

More particularly, a variety of investigators have reported utilizing a stream or Jet spray of carbon dioxide, also known as "dry ice snow", to remove molecular and particular contaminants from a variety of surfaces including silicon wafers, telescope mirrors and thin film optical coatings.

To form a carbon dioxide Jet spray, liquid carbon dioxide from a cylinder is expanded through a device which has an orifice and a nozzle. Rapid expansion of the carbon dioxide liquid causes the formation of fine particles of solid $CO_2$ which become entrained in the carbon dioxide gas. The size of the orifice and the nozzle configuration are adjusted to obtain the desired $CO_2$ snow. With this configuration, a jet of high velocity snowflakes is produced and is directed at the surface to be cleaned. The term "snow" is used herein to mean a stream of gas entraining solid particles of such gas.

The formation and use of carbon dioxide snow is disclosed in the following articles and patent, the contents of which are hereby incorporated by reference: S. A. Hoening, "Cleaning Surfaces with Dry Ice", Compressed Air Magazine, August 1986; R. V. Peterson, C. W. Bowers, "Contamination Removal by $CO_2$ jet spray," SPIE, Vol. 1329, Optical System Contamination Effects, Measurements, Control II, 1990; L. Layden, D. Wadlow, "High Velocity Carbon Dioxide Snow For Cleaning Vacuum System Surfaces," Journal of Vacuum Science and Technology, A8 (5) September/October 1990; R. Sherman, W. H. Witlock, "The Removal of Hydrocarbons and Silicon Grease Stains from Silicon Wafers", Journal of Vacuum Science Technology, B8 (3) May/June 1990; R. Zito, "Cleaning Large Objects with $CO_2$ Snow", SPIE Vol. 1236, Advance Technology Optical Telescopes IV, 1990; U.S. Pat. No. 4,806,171 for "Apparatus and Method for Removing Minute Particles from a Substrate" issued to Whitlock et al.

The use of carbon dioxide snow to clean delicate surfaces has shown promise. However, as with any new technology, there is a continual need to further develop and improve the state of the art.

SUMMARY OF THE INVENTION

In accordance with the present invention, an improved apparatus and method are provided for removing contaminants from the surface of substrates. The improvement consists of heating a specific portion of a chosen substrate surface immediately before, during and/or after application of a stream of cleaning snow to the same portion of the substrate surface.

It has been discovered that the use of carbon dioxide jet sprays is more effective in removing organic and other molecular and particulate contaminants from the surface of delicate or precision substrates if the substrate surface is warmed to a temperature well above the temperature of the cleaning snow immediately before application of the cleaning snow to the substrate surface.

It has also been discovered that cleaning snows are more effective in cleaning substrate surfaces if the substrate surfaces are warmed to a temperature well above the dew point of ambient vapors immediately after application of the cleaning snow to the substrate surface. Carbon dioxide snow is very cold, around minus 60 degrees centigrade at ambient pressures. Depending on the substrate and the dwell time for the cleaning snow, the temperature of the substrate surface may fall below the dew point thereby causing moisture in the ambient environment to condense on the substrate surface. This has proven disadvantageous as the condensed vapors may entrain airborne contaminants which will remain on the substrate surface after the condensate evaporates.

The cooling associated with carbon dioxide snow is particularly disadvantageous in dealing with small precision instruments which have a negligible thermal mass, especially if the parts cannot be subjected to prolonged temperature extremes. The integrity of these parts can be maintained by heating the substrate surface both before, during and after application of a cleaning snow to the substrate surface.

As a feature of the present invention, the improved method includes the step of heating a selected portion of the substrate surface before application of the stream of cleaning snow to the selected portion of the substrate surface. The substrate surface is heated to a temperature typically ranging from 40 to 60 degrees centigrade.

As another feature of the present invention, the improved method includes the step of reheating the selected portion of the substrate surface after application of the stream of cleaning snow to the selected portion of the substrate surface. The substrate surface is reheated to a temperature which is at least 20 degrees centigrade above the dew point of ambient vapors.

As yet another feature of the present invention, the improved method may include the step of heating the selected portion of the substrate surface during the cleaning process.

As yet one more feature of the present invention, the selected portion of the substrate surface may be heated or reheated by applying one or more streams of heated gas to the selected portion of the substrate surface before, during and/or after application of the stream of cleaning snow to the selected portion of the substrate surface.

As yet, one more feature of the present invention, an improved apparatus utilizing the above-described method is provided for removing contaminants from the surface of a substrate. The improved apparatus includes a first spray device for producing a stream of cleaning snow and a second spray device for producing a first stream of heating gas. The second spray device may be positioned relative to the first spray device such that, if the improved apparatus is moved in a direction parallel to the surface, the first stream of heating gas will engage a selected portion of the substrate surface before, during or after the stream of cleaning snow engages the same portion of the substrate surface.

As an alternative feature of the present invention, the improved apparatus is provided with a third spray device for producing a second stream of heating gas. The first, second and third spray devices are positioned relative to one another such that, if the improved apparatus is moved in a direction parallel to the substrate surface, the first stream of heating gas will engage a selected portion of the substrate surface before the stream of cleaning snow engages the same portion of the substrate surface and the second stream of heating gas will engage a selected portion of the substrate surface after the stream of cleaning snow engages the same portion of the substrate surface.

As an additional feature of the present invention, the improved apparatus includes a first heating coil which is provided within the second spray device for heating the first stream of heating gas to a first elevated temperature and a second heating coil which is provided within the third spray device for heating the second stream of heating gas to a second elevated temperature.

As yet an additional feature of the present invention, the above-described heating coils are provided with conductors which are resistant to corrosion at the preferred first and second elevated temperatures.

As yet one more feature of the present invention, the second and third spray devices are provided with first and second thermally non-conductive linings which circumscribe the first and second heating coils thereby insulating the outer bodies of the first and second spray devices from the heat generated by the first and second heating coils.

The above features and many other features and advantages of the present invention will become better understood by reference to the following detailed description when taken in conjunction with the accompanying drawings.

BRIEF DESCRIPTION OF THE DRAWING

FIG. 1 is a schematic representation of a first preferred exemplary apparatus including a first preferred heating gas spray device; and FIG. 2 is a schematic representation of a second preferred exemplary heating gas spray device, showing a preferred exemplary heating coil and thermally non-conductive lining therefor, in disassembled relation.

DESCRIPTION OF PREFERRED EMBODIMENTS

The following detailed description will be directed to apparatus and methods for use in removing contaminants from the surface of a chosen substrate, such as a delicate or precision surface typically utilized in precision optical, electro-optical and electronic equipment and precision hardware. Although the principal use for the improved apparatus and methods is in removing trace amounts of contaminants from optical surfaces and critical electronic surfaces, those skilled in the art will understand that the apparatus and methods of the present invention have much wider applications and may be used to clean any surface or structure requiring high levels of cleanliness or precision cleaning. For example, the present invention may be used to clean surfaces prior to painting, coating, or bonding where contaminants must be removed without damaging the cleaned surface.

It will be further understood by those skilled in the art that the present invention is not limited to cleaning applications wherein carbon dioxide snow is the preferred cleaning medium. Rather, the present invention contemplates that any chemical material that exists in gas, liquid and solid states which can be formed into a snow, including, but not limited to, nitrogen, argon and neon, may be used as the cleaning medium. Preferably, carbon dioxide is used because of its relative low cost in comparison to the other materials, especially neon, and the desirable properties of carbon dioxide.

In accordance with the present invention, the improved method for removing contaminants from a surface of a substrate includes the step of heating a selected portion of the substrate surface before or after application of a stream of cleaning snow to the selected portion of the substrate surface. Preferably, the selected portion of the substrate surface is heated immediately before application of the stream of cleaning snow to the selected portion of the substrate surface and reheated immediately after application of the stream of cleaning snow to the selected portion of the substrate surface.

Heating of the substrate surface immediately before application of the stream of cleaning snow to the substrate surface improves the effectiveness of cleaning snows in removing organic and other molecular particulate contaminants from the substrate surface. Heating of the substrate surface immediately after application of the stream of cleaning snow to the substrate surface prevents the build up of contaminant-entraining condensates on the surface of the substrate.

Preferably, the selected portion of a substrate surface is preheated to a first elevated temperature ranging between 20 and 160 degrees centigrade above the temperature of the cleaning snow. For applications wherein the carbon dioxide snow is the preferred cleaning medium, the first elevated temperature preferably ranges between 40 and 60 degrees centigrade above freezing. The substrate surface is reheated to a temperature which is at least 20 degrees centigrade above the dew point of ambient vapors. In most applications, the substrate surface is reheated to a temperature which is equal to or above the first elevated temperature.

Preferably, the selected portion of the substrate surface is heated and reheated by applying one or more streams of heating gas to the selected portion of the substrate surface, before, during and/or after application of the stream of cleaning snow to the selected portion of the substrate surface.

The heating gas is preferably selected from the group of inert or substantially inert gases which include nitrogen, carbon dioxide and argon. Dry air may be suitable for some applications.

A first preferred exemplary apparatus utilizing one or more streams of gas to heat a selected portion of the substrate surface is shown generally at 10 in FIG. 1. The apparatus 10 includes a first spray device 20 for producing a stream of carbon dioxide cleaning snow, a first housing 30 for supporting the first spray device 20, a second spray device 40 for producing a first stream of heating gas, and a second housing 100 for supporting the second spray device.

The first spray device 20 includes an inlet 22 for receiving liquid carbon dioxide, preferably from an ultra-pure carbon dioxide source (not shown), a valve assembly (not shown) having a critical orifice through which the liquid carbon dioxide is expanded into cleaning snow, and a nozzle 24 having an exit port 26 for transmitting the carbon dioxide snow to the chosen substrate. Preferably, vernier 28 is provided for accurate and repeatable adjustments of the cleaning snow flow rate.

The temperature and pressure of the carbon dioxide entering the first spray device 20 through inlet 22 is controlled in accordance with prior teachings regarding the formation of carbon dioxide snow.

The first spray device also includes an intermediate outer surface 25 which is engaged by first housing 30 by suitable means. Preferably, first housing 30 is provided with an interior cavity (not shown) which is configured for slidably receiving outer surface 25 so as to permit first spray device 20 to be adjustably positioned along longitudinal axis 29A. In the preferred embodiment, nozzle 24 is detachably connected to first spray device 20 thereby enabling the operator to replace nozzle 20 with other nozzles of differing sizes and shapes.

The second spray device 40 includes a tubular body 42 having a first end 44 and a second end 46. Tubular body 42 is provided with an inlet port 48 between first and second ends 44 and 46 for receiving a preferred gas from a pressurized gas source (not shown). Tubular body 42 is also provided with an outlet 50 at second end 46 for transmitting the preferred gas to the chosen substrate.

Tubular body 42 includes outer wall 49 and inner wall 51. Inner wall 51 defines a substantially cylindrical interior cavity 52. Provided within interior cavity 52 is a heating coil 54 and thermally non-conductive lining 56 as best shown in FIG. 2. Heating coil 54 includes an elongate conductor 58 and a non-conductive support 60. Non-conductive support 60 includes a cylindrical end section 62 and a tubular lead support 64. Cylindrical end section 62 includes an outer face 66, an inner face 68 and exterior surface 69, and first and second elongate cavities 70 and 72, both of which extend between inner and outer faces 66 and 68 for receiving elongate conductor 58. Tubular lead support 64 includes third and fourth ends 74 and 76 and extends therebetween along longitudinal axis 79A. Tubular lead support 64 defines a third elongate cylindrical cavity 78 which adjoins the first elongate cavity 70.

Elongate conductor 58 is provided with a first section 80 which extends from outer face 66 through first and third elongate cavities 70 and 78, respectively, to fourth end 76. Conductor 58 is also provided with a second section 82 which adjoins first section 80 at fourth end 76. Second section 82 includes a coiled portion 84, which extends between first section 80 and inner face 68, and a straight portion 86, which extends through the second elongate cavity 72 to outer face 66.

The first section 80 and straight portion 86 of conductor 58 are integrally formed with non-conductive support 60 so as to form a single part. Preferably, coiled section 84 is attached to first section 80 and straight portion 86 by welding and thus can be replaced if necessary. Outer face 66 of cylindrical end section 62 is provided with suitable means (not shown) for connecting first and second straight sections 80 and 86 to a variable power supply (not shown).

Heating coil 54 is configured so as to permit its insertion into tubular body 42 at first end 44. Preferably, the tolerance between the exterior surface 69 of cylindrical end section 62 and the inner wall 51 of tubular body 42 is minimal. Sealing means (not shown) are provided to prevent the egress of the preferred gas between cylindrical end section 62 and interior wall 51. Cylindrical end section 62 must be positioned within interior cavity 52 so as not to block the flow of the preferred gas entering the second spray device 40 through inlet port 48. Preferably, tubular body 42 is sufficiently long to ensure that the heating coil 54 does not extend beyond second end 46 of tubular body 42. This configuration protects the operator of the second spray device 40 from direct contact with conductor 58 and consequential injury.

In the preferred exemplary embodiment, the outer diameter of the center lead support 64 is substantially narrow relative to the inner diameter of interior cavity 52 thereby defining an annular cavity for receiving the preferred gas from inlet port 48 and for transferring heat thereto, by way of the coiled section 84 positioned therein, as the preferred gas is transmitted toward outlet 50.

Thermally non-conductive lining 56 is substantially tubular in shape and has an outer surface 92, an inner surface 94, and an annular wall 96 extending therebetween. The outer surface 92 is configured so as to ensure that lining 56 may be slidably inserted into interior cavity 52 of tubular body 42 from second end 46 without blocking inlet port 48 while at the same time providing for minimal clearance between outer surface 92 and inner wall 51. Preferably, annular wall 96 is relatively thin so as to maximize the area wherein coiled section 84 interfaces with the preferred gas.

In assembled relation, the non-conductive lining extends between inlet port 48 and second end 46 without blocking inlet port 48. Non-conductive lining 56 is connected to inner wall 51 using any suitable means. Preferably, sealing means (not shown) are also provided to prevent the egress of the preferred gas between lining 56 and inner wall 51.

Non-conductive support 60 is preferably composed of a ceramic material while non-conductive lining 56 is preferably composed of a substance in the class of materials including pyrex and quartz. Because the preferred insulators are fragile, it is also preferred that the tubular body 42 be composed of a non-fragile material such as electro-polished stainless steel.

The non-conductive lining 56 improves the efficiency of the heat transfer process while at the same time facilitating safe operation of the second spray device 40 by ensuring that the outer surface of tubular body 42 does not become dangerously hot thereby exposing the operator to the risk of injury.

As best shown in FIG. 1, the second spray device 40 is provided within a second housing 100 which is fixed in a position substantially adjacent first housing 30 using any suitable means. Preferably, a ceramic insulator 101 is provided between first and second housings 40 and 100.

Second housing 100 comprises a ball joint assembly 102 which includes a ball support 104 and a spherical ball 106. Spherical ball 106 is provided with an outer arcuate surface 108 and a cylindrical cavity 110 which extends through the center of spherical ball 106.

Cylindrical cavity 110 is configured to receive and engage the outer surface 49 of tubular body 42 upon insertion of tubular body 42 into cylindrical cavity 110. Ball support 104 is configured to engage the outer arcuate surface 108 of spherical ball 106 so as to permit rotational movement of spherical ball 106 (and the second spray device 40 engaged therewith) through a range of approximately 60 degrees in any direction. With second housing 100 fixed in a position relative to first housing 30 as best shown in FIG. 1, any rotation of second spray device 40 changes the angle of incidence between the first stream of heated gas and the stream of cleaning snow.

More specifically, the second spray device 40 may be adjustably rotated such that the first stream of heated gas either converges with, is parallel to or diverges from the stream of cleaning snow.

In order to ensure that the selected portion of the substrate surface is heated in accordance with the present invention, the second spray device produces a stream of heating gas which generates a "footprint" on the selected portion of the substrate surface which is sufficiently large to circumscribe the "footprint" generated on the same portion of the substrate by the stream of cleaning snow.

The second spray device 40 may also be provided with a means for adjusting the shape of the stream of heating gas. In one preferred embodiment (not shown), different tips may be provided at second end 46 of tubular body 42 to vary the fan shape of the hot gas effluent.

In operation, second spray device 40 is fixed in position relative to first spray device 20 so as to provide for localized heating on a portion of the chosen substrate either before, during and/or after application of the stream of cleaning snow to the same portion of the substrate.

In a second preferred embodiment of the present invention as best shown in FIG. 2, the second spray device comprises a dual gas manifold 120 having two interconnected parallel first and second tubular sections 122 and 124 for producing first and second parallel streams of heated gas. First tubular section 122 includes a first inlet 126 and a first outlet 128. Second tubular section 124 includes a second inlet 130 and a second outlet 132. Both first and second tubular sections 122 and 124 are provided with a heating coil 54 and a thermally non-conductive lining 56.

Preferably, a first spray device 20 is positioned in parallel between first and second tubular sections 122 and 124 such that, if the improved apparatus is moved in a direction parallel to a chosen substrate surface, the first stream of gas will engage a portion of the substrate surface before the stream of cleaning snow engages the same portion of the substrate surface and the second stream of gas will engage the same portion of the substrate surface after the stream of cleaning snow engages that portion of the substrate surface. Conversely, if the improved apparatus is moved in a second direction which substantially opposes the first direction, the second stream of gas will engage a portion of the substrate surface before the stream of cleaning snow engages the same portion of the substrate surface and the first stream of gas will engage the same portion of the substrate surface after the stream of cleaning snow engages the same portion of the substrate surface.

In operation, the second preferred exemplary apparatus may be moved, as a first step, in the first direction parallel to the substrate surface with both hot gas jet sprays in operation so as to preheat a selected portion of the chosen substrate before application of the cleaning snow. The improved apparatus may then be moved, as a second step, in the opposite direction with all three jet sprays operating so to preheat and reheat to substrate surface immediately before and after application of the stream of cleaning snow to the substrate surface. Thereafter, the first step may be repeated so as to ensure complete reheating of the chosen substrate.

In either of the foregoing described preferred embodiments, the temperature of the effluent heating gas is a function of the flowrate of the preferred gas, the temperature of coiled portion 84 and the heat transfer characteristics of the preferred gas and the preferred conductor 58. The flowrate of the preferred gas may be controlled utilizing any suitable means, i.e., conventional needle, solenoid, or other valves. The temperature of the coiled portion 84 may be controlled using a variable power supply and/or the flowrate of the gas.

Preferably, the power supply includes an interlock to prevent operation of heating coil 54 without adequate flow of the preferred gas so as to ensure the coiled portion 84 does not exceed a critical temperature, i.e., a temperature whereat oxidation of the preferred conductor 58 is induced or the substrate to be cleaned is damaged.

Oxidation is undesirable because an oxidized conductor is a potential source of particulate contamination. Elongate conductor 58 is preferably composed of a material in the class of conductors which are resistant to oxidation at the preferred temperature for the heated gas. Nicrome has proven an effective conductor 58 for numerous applications.

Where oxidation of the coiled portion 84 proves problematic, alternative heating means may used. For example, the coiled portion 84 may be wrapped outside of an inert material or, alternatively, the selected portion of the substrate surface may be heated using radiant energy.

The use of an inert or substantially inert gas will mitigate against corrosion of the chosen conductor 58. The inclusion of a gas filter (not shown) upstream of the gas inlet to trap contaminants originating from the preferred gas supply is also desirable so as to further ensure the purity of the gas streams. Waferguard ® filters (a trademark of Millipore) have proven suitable for numerous applications.

The power supply may also include an interlock to prevent operation of heating coil 54 without adequate flow of the cleaning snow. This ensures against overheating of temperature sensitive parts.

In preferred embodiments utilizing an electrically operated cleaning snow spray device, the power supplies for the first and second spray devices may be interconnected and programmed for pulsed or sequential operation.

Having thus described the foregoing exemplary embodiments of the present invention, it should be noted by those skilled in the art that the disclosures within are exemplary only and that various other alternatives, adaptations and modifications may be made within the scope of the present invention. Accordingly, the scope of the present invention is not limited to the specific embodiments as illustrated herein, but is only limited by the following claims and equivalents thereof.

What is claimed is:

1. In a method for cleaning the surface of substrates wherein a stream of cleaning snow is directed against a portion of a substrate surface to remove contaminants located thereon, the improvement comprising the step of heating with heating gas said portion of the substrate surface before application of said stream of cleaning snow to said portion of said substrate surface to a first elevated temperature which is above the temperature of said cleaning snow or after application of said stream of cleaning snow to said portion of said substrate surface to a second elevated temperature which is above the dew point of ambient vapors.

2. The method of claim 1 comprising the step of heating a portion of the substrate surface before application of said stream of cleaning snow to said portion of said substrate surface.

3. The method of claim 1 comprising the step of heating said portion of said substrate surface after application of said stream of cleaning snow to said portion of said substrate surface.

4. The method of claim 2 wherein said portion of said substrate surface is heated to a first elevated temperature which is sufficient to enhance removal of contaminants from said portion of said substrate without damaging said substrate.

5. The method of claim 4 wherein said first elevated temperature ranges between 20 and 160 degrees centigrade.

6. The method of claim 5 wherein said cleaning snow is selected from the group of substances including nitrogen, carbon dioxide, argon and neon.

7. The method of claim 6 wherein said cleaning snow comprises carbon dioxide.

8. The method of claim 7 wherein said first elevated temperature is between 40 and 60 degrees centigrade.

9. The method of claim 2 further comprising the step of reheating said portion of said substrate surface after application of said stream of cleaning snow to said portion of said substrate surface.

10. The method of claim 9 wherein said portion of said substrate surface is reheated to a second elevated temperature which is sufficient to inhibit the formation of condensates on said portion of said substrate surface.

11. The method of claim 10 wherein said second elevated temperature is at least 20 degrees centigrade above the dew point for ambient vapors.

12. The method of claim 2 comprising the step of applying a first stream of heating gas to said portion of said substrate before application of said stream of cleaning snow to said portion of said substrate.

13. The method of claim 12 further comprising the step of reheating said portion of said substrate surface after application of said stream of cleaning snow to said portion of said substrate surface by applying a second stream of heating gas to said portion of said substrate after application of said stream of cleaning snow to said portion of said substrate.

14. The method of claim 13 wherein said cleaning gas is selected from the group of substances including nitrogen, carbon dioxide, dry air and argon.

15. In a method for cleaning the surface of substrates wherein a stream of cleaning snow is directed against a portion of a substrate surface to remove contaminants located thereon, the improvement comprising the step of heating with heating gas said portion of the substrate surface before application of said stream of cleaning snow to said portion of said substrate surface to a first elevated temperature which is above the temperature of said cleaning snow and after application of said stream of cleaning snow to said portion of said substrate surface to a second elevated temperature which is above the dew point of ambient vapors.

16. The method of claim 15 further comprising the step of heating said portion of said substrate surface during application of said stream of cleaning snow to said substrate surface.

* * * * *